United States Patent [19]

De Vries

[11] 4,392,116
[45] Jul. 5, 1983

[54] TRIPLE TRANSIT CANCELLATION

[75] Inventor: Adrian J. De Vries, Mount Prospect, Ill.

[73] Assignee: Zenith Radio Corporation, Glenview, Ill.

[21] Appl. No.: 196,247

[22] Filed: Oct. 14, 1980

[51] Int. Cl.³ .......................... H03H 9/64; H03H 9/42
[52] U.S. Cl. ................................... 333/194; 333/153; 333/195; 333/196; 310/313 D
[58] Field of Search ................................ 333/150–155, 333/193–196; 310/313 R, 313 A, 313 B, 313 C, 313 D, 366; 331/107 A

[56] References Cited

U.S. PATENT DOCUMENTS

| | | | |
|---|---|---|---|
| 3,662,293 | 5/1972 | De Vries | 333/151 |
| 4,060,833 | 11/1977 | Onyshkevych | 333/194 X |
| 4,083,021 | 4/1978 | Autran et al. | 333/194 |
| 4,146,851 | 3/1979 | Dempsey et al. | 333/194 |
| 4,342,011 | 7/1982 | Iwamoto et al. | 333/153 X |

Primary Examiner—Marvin L. Nussbaum

[57] ABSTRACT

In order to suppress triple transit ghost images in a T.V. receiver, a surface wave acoustic filter is provided in which either the input or output transducer system, or both, includes both primary and dummy transducers, the echoes from which cancel each other totally. The dummy transducer is designed as a function not only of position along the acoustic beam path, but also as a function of the number of elemental transducers and their interdigitated lengths; and the design also takes into account relevant electrical parameters including transducer admittances and any external or parasitic impedances under short circuit and open circuit conditions. These factors are taken into account not only for the primary transducer, but also for the dummy transducer. The result is a completely general phasor expression which establishes the design criteria for a dummy transducer to achieve echo phase opposition and amplitude equality, relative to a given primary transducer and a given external circuit under all frequency conditions. The result is complete echo cancellation over the entire bandwidth of the filter.

10 Claims, 3 Drawing Figures

TRIPLE TRANSIT CANCELLATION

This invention relates generally to acoustic devices for processing signals. It particularly concerns a surface wave integrable filter (SWIF) with special reflection cancellation features.

BACKGROUND

Surface acoustic wave devices have won a niche in the electronic signal processing art. They are especially common as intermediate frequency bandpass filters in the I.F. sections of television receivers. These devices comprise an input interdigital transducer and an output interdigital transducer on a common substrate. The input transducer receives an electrical signal and converts it to an acoustic wave which is transmitted over the substrate to the output transducer. The output transducer then reconverts the acoustic wave to an electrical output. The frequency response of both transducers is a passband centered on the I.F. of the T.V. receiver.

A problem which has been encountered with such filters is caused by acoustic echoes. The acoustic signal generated by the input transducer is not fully converted into electrical energy by the output transducer. Some of this acoustic energy is reflected from the output transducer back to the input transducer (first reflection). Then a portion of the first reflection is re-reflected from the input transducer back to the output transducer (second reflection). An acoustic wave which has made three one-way trips (input to output, back to input, and back to output again) is called the triple transit reflection. Because of the transit time required, the reflection is delayed relative to the original signal. Consequently, when S.W.I.F. devices are used as I.F. filters in T.V. receivers, the triple transit reflection can cause an unacceptable ghost image on the picture tube.

This is particularly true when it is desired to reduce the insertion loss of the filter. Two options are available to accomplish this objective: use of a filter substrate material with a higher coupling factor; and reduction of matching losses by transducer tuning (i.e., adding an external inductance to balance the capacitive reactance of the transducer at the signal frequency). Both of these approaches have the unfortunate side effect of increasing echo amplitudes, often to unacceptable levels. Thus, where low insertion loss is a requirement, triple transit reflections can cause difficulty.

A significant body of prior art is devoted to the solution of this problem. Most of this art is directed at mitigating or overcoming the effects of the first reflection (from output transducer to input transducer). Few attempts appear to have been made to mitigate or overcome the effects of the second reflection (from input transducer to output transducer) or, better yet, of both reflections.

DeVries U.S. Pat. No. 3,727,155, Deacon U.S. Pat. No. 3,984,791, and Hunsinger et al. U.S. Pat. No. 4,162,465, recognize that when the interdigitated fingers of the input and/or output transducers are bifurcated and both halves thereof are connected to the same bus bar ("split-connected") then reflection amplitudes can be substantially reduced. When split-connected fingers are used on both the input and output transducers, as in the DeVries and Deacon patents, then both the first and second reflection amplitudes can be reduced. This phenomenon, however, depends heavily upon the external impedances connected across the transducers, and therefore is not a general solution to the problem.

Gilchrist et al. U.S. Pat. No. 4,205,280 employs an electrically isolated transducer finger to ameliorate reflection problems. The theory of operation of the Gilchrist et al. device is that reflections from the isolated finger will be in phase opposition to reflections from other fingers, and thus cause some degree of phase cancellation.

Various other prior art approaches also depend upon phase cancellation phenomena. Coussot U.S. Pat. No. 4,025,880 employs a metallic wafer for phase shifting, while Dempsey et al. U.S. Pat. No. 4,146,851 makes use of a special reflector plus phase shifts introduced by a multistrip track coupler.

A number of prior art devices employ an extra transducer to create out-of-phase effects which partially cancel the unwanted reflection. In Hunsigner U.S. Pat. No. 3,908,137 there is an extra input transducer, electrically delayed relative to the primary input transducer. In Dias U.S. Pat. No. 3,596,211, Knowles U.S. Pat. No. 3,626,309, and Jones U.S. Pat. No. 3,810,257 there is an extra output transducer, shifted along the acoustic beam axis by a fraction of a wavelength relative to the primary output transducer. In the Dias patent the extra output transducer is a "dummy," i.e., it is not electrically connected to the output circuit of the primary output transducer. The present invention is an improvement upon that type of device.

Phase cancellation schemes which depend solely upon displacements along the acoustic beam axis generally suffer from bandwidth limitations. A surface acoustic transducer can be designed to have a relatively narrow or broad bandwidth, by proper choice of the spacing between interdigitated pairs of transducer elements. Thus the effective bandwidth of many triple transit phase cancellation schemes can be narrower than the passbands of the transducers with which they are used.

Moreover, phase opposition alone is insufficient to guarantee total or even near-total cancellation of unwanted echoes, unless the amplitudes of the opposed reflections are equalized.

This invention attempts to control both phase and amplitude, to achieve triple transit echo cancellation.

Moreover, the invention attempts to control phase and amplitude relationships over the entire bandwidth of the device.

The invention recognizes that the echo of a dummy transducer must not only be in phase opposition to the unwanted reflection, but that it must also achieve amplitude equality so that the goal of total cancellation can be reached. The choice of an offset along the acoustic beam axis is not sufficient in itself to guarantee total cancellation, even at the center frequency of the passband. A phasor expression which specifies the amplitude and phase of an acoustic echo under all conditions is a function not only of position along the acoustic beam axis, but also of the number of interdigitated transducer elements and their interdigitated lengths.

In addition the phasor is also a function of such electrical parameters as the admittances of the transducer itself and of any external or parasitic impedances across it, including short-circuit (zero impedance) and open circuit (high impedance) conditions. Moreover, these factors must be taken into account not only for the primary transducer (in order to calculate the general phasor expression for its reflection under any operating conditions) but also for the dummy transducer (in order to calculate the same phasor for the dummy) and thus guarantee phase opposition and equality of amplitude between the two phasor quantities.

When this unprecedented level of sophistication in design is employed, the reflections from the primary and dummy output transducers not only achieve full cancellation, but the results are valid over the entire bandwidth of the transducers employed because the admittances employed in its calculations are frequency-dependent variables.

Cancellation of the second reflection is also a possibility. The invention contemplates dividing the input transducer into primary and dummy sections, and arranging the dummy input transducer so that its second reflection cancels the second reflection from the primary input transducer. Furthermore the input and output transducer system may both be divided into primary and dummy sections, and the dummy sections arranged for cancellation of both reflections. Preferably a compensated input transducer system of this kind is designed according to the same mathematically sophisticated phasor cancellation criteria described above.

Additionally, the invention contemplates the use of apodization, or finger length weighting, to improve the frequency response characteristics of a transducer system which comprises both a primary and a dummy transducer.

The foregoing features of the invention, as well as others, will be more fully appreciated from a reading of the detailed description of the preferred embodiments which appears below, when read in conjunction with the following drawings.

DRAWINGS

DETAILED DESCRIPTION OF THE PREFERRED EMBODIMENTS

Figure 1:
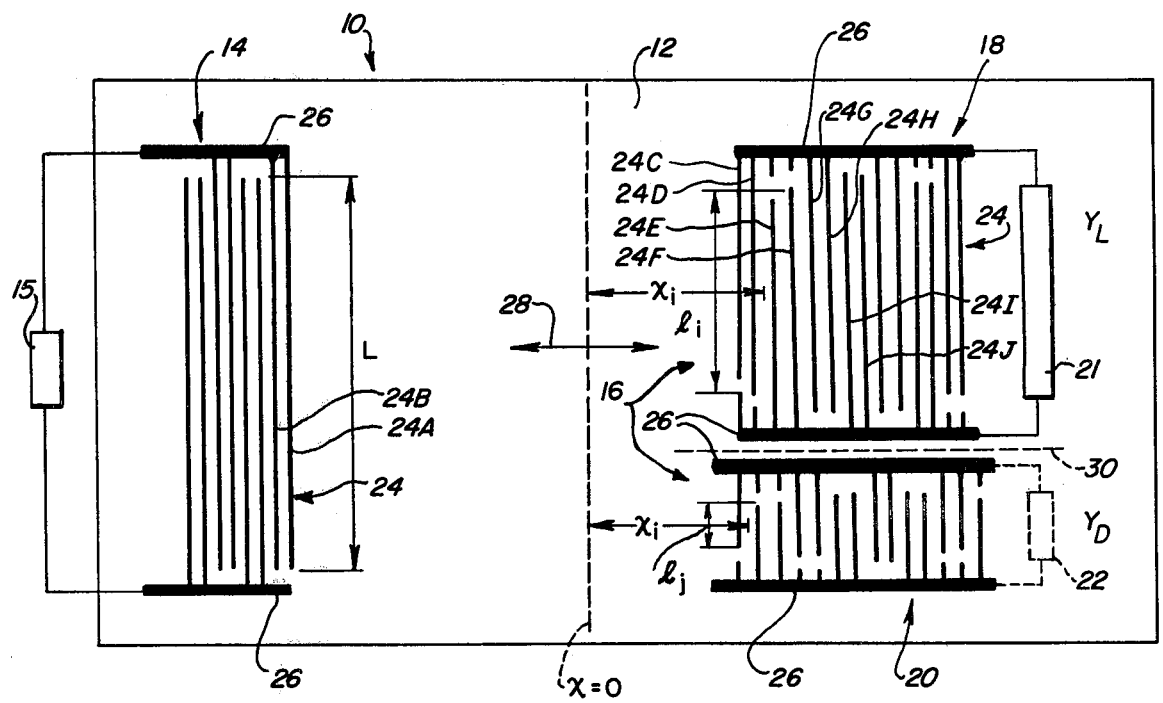
FIG. 1 is a schematic illustration of a surface acoustic wave filter in which one of two transducer systems is optimized for reflection suppression purposes in accordance with this invention.

In FIG. 1 a filter 10 comprises a substrate 12, preferably of a piezo-electric crystalline material, upon which are printed metallic lines defining a simple transducer system 14 electrically connected to a useful external circuit 15, and a compound transducer system 16 acoustically coupled to the simple system 14. Transducer system 14 is "simple" in the sense that it includes only a single transducer.

Transducer system 16 is "compound" in the sense that it comprises two separate transducers 18 and 20. But only transducer 18 is the "primary" transducer of system 16, in the sense that it is connected to a useful external circuit 21. Transducer 20 is a "dummy" output transducer in the sense that it is not connected to any useful external circuit. Its external circuit 22, if any, is electrically isolated from circuit 21, and serves no purpose other than to provide a desired external impedance for transducer 20. Dummy output transducers per se are not new. Their use is disclosed in Dias U.S. Pat. No. 3,596,211.

Either transducer system 14 or 16 can be connected to an electrical signal input, while the other is connected to provide an electrical output. Thus either one of the useful external circuits 15 or 21 can be the input source, while the other be the output load. If filter 10 is used in a T.V. I.F. section, the input source would be the R.F. detector section, and the output load would be the circuitry which processes the I.F. signal after filtering by S.W.I.F. device 10. In each instance the impedances of these source and load circuits would be dictated by their function and the nature of the circuits. In contrast, the impedance of external circuit 22, if any, is chosen solely to meet the requirements of echo cancellation in accordance with this invention.

As is conventional, the transducers 14, 18 and 20 are all of the interdigital type comprising interdigitated elements or fingers 24 alternately connected to pairs of bus bars 26 which provide the external electrical terminals of the transducers. Each finger 24 of each transducer employed in this embodiment is of the split-connected type which is bifurcated into two halves 24A and 24B both connected to the same one of the bus bars 26. In the case of the compound transducer system 16, the use of split-connected fingers is an optical choice, usually made for the purpose of reducing reflection levels. But in the case of the simple transducer system 14, there is an additional consideration which mandates the use of split-connected fingers or some equivalent design approach.

Such fingers have the property that their reflection response to an impinging surface acoustic wave depends entirely upon the voltage induced in the fingers by the wave, and not upon mechanical impedance effects. Since the transducer fingers are electrically conductive, a voltage induced in any one portion of a finger is instantly communicated to all other portions of the finger, so its associated bus bar, and to all other fingers commonly connected to that same bus bar. Thus, although transducers 18 and 20 are both offset relative to the center of transducer 14, a voltage induced in one "side" of transducer 14 by the echo arriving from primary transducer 18 is effectively impressed upon all of transducer 14, and similarly a voltage impressed upon the other side by dummy transducer 20 is also effectively impressed upon all of transducer 14. Therefore the net voltage impressed upon the transducer 14 by the two echoes is simply the phasor sum of their individual voltages. Since the reflection caused by these echoes upon reaching the transducer 14 depends solely upon that net voltage, the use of split-connected fingers in that transducer is an ideal way to integrate the reflection effects of the two echoes and thus achieve phase cancellation.

One other finger configuration is known to approximate the same echo-integrating effect; i.e., 75% duty cycle single fingers. The term "single" in this context refers to solid (non-split) fingers, and the term "duty cycle" refers to the width of the single fingers relative to the spatial periodicity of the fingers. Thus 75% duty cycle fingers occupy 75% of each spatial period, while each intervening space occupies 25%. Fingers of this configuration can be used in the transducer 14, but are not preferred because they do not completely integrate the echoes.

In order to optimize the frequency response of a given transducer, it may be "apodized"; that is, the interdigitated lengths of its fingers 24 may vary as a selected function of distance along the acoustic beam axis (arrow 28). The art well understands how to accomplish this. But it is not advisable to apodize two or more acoustically coupled transducers (i.e., one or more transducers which emit an acoustic wave and one or more other transducers which receive it; or one or more transducers which reflect an acoustic wave and one or more other transducers which receive that reflection) without making sure that the aperture of each elemental receiving transducer effectively covers the entire aperture of each elemental transducer which emits or reflects acoustic waves thereto. (An "elemental" transducer is any pair of neighboring fingers, or split fingers, as the case may be.) In the past, when dummy or other extra transducers have been used to promote phase cancellation of triple transit reflections, apodization appears not to have been employed, and in particular it was not employed on more than one of the three or more transducers which are required for such a phase cancellation scheme.

There are two ways to match apertures when one or more acoustically coupled interdigital transducers are apodized. One way is to use a constant (non-apodized) interdigitated finger length on one of the transducers, and make its interdigitated length at least equal to the total span of the maximum interdigitated lengths of all the apodized elemental interdigital transducers which are directly coupled thereto. The other way is to put the transducers on different tracks, and couple them indirectly by using a multi-strip track coupler device to couple all their respective tracks, making sure that the track coupler spans the maximum interdigitated lengths of each transducer (apodized or not) on each track. In accordance with one aspect of this invention, both of these methods are employed, in different embodiments.

In the embodiment of FIG. 1, the first method is employed. Both the primary transducer 18 and the dummy transducer 20 are apodized. In the case of primary transducer 18, the interdigitated (or overlapping) length $l_i$ (see FIG. 1) of any one pair of adjacent split fingers 24 (for example, the distance over which the split finger comprising halves 24C, D overlaps the adjacent split finger comprising halves 24E, F) is in general unequal to the interdigitated length $l_i$ of any other pair of adjacent split fingers in the same transducer (for example, the distance over which the split finger comprising halves 24G, H overlaps one of its two adjacent split fingers such as the one comprising halves 24E, F or the one comprising halves 24I, J). A similar description applies to the interdigitated finger lengths $l_j$ of the apodized dummy transducer 20. Because these interdigitated finger lengths $l_i$ and $l_j$ are unequal within each apodized transducer 18 and 20, the apertures over which they reflect acoustic waves back to the simple transducer 14 are also unequal. Thus, in order to be acoustically coupled to the aperture of each pair of interdigitated fingers 24 in a given pair of transducers 18 and 20, the simple transducer 14 is not apodized, and has a constant interdigitated finger length L large enough to span the entire maximum aperture of both transducers 18 and 20.

The transducers 18 and 20 are located on separate tracks divided by an imaginary boundary 30, each track extending parallel to the acoustic beam axis direction 28. The interdigitated finger length L of the input transducer 14 spans the sum of the breadths of the tracks of both transducers 18 and 20. As a result, the interdigitated length of each adjacent pair of split fingers 24 in transducer 14 receives acoustic reflections from the entire interdigitated length of each pair of split fingers 24 of both transducers 18 and 20. If both transducers 18 and 20 are to produce phase-cancelling reflection effects upon the transducer 14, it is essential that such total coupling be achieved, notwithstanding the apodization of either or both transducers 18 and 20.

Note that, in general, in an apodized transducer such as 18 or 20 the interdigitated lengths of any pair of commonly electrically connected finger halves (such as 24C and D, or 24E and F) are unequal. In such cases the effective interdigitated length of that pair of split finger halves and a neighboring pair of split finger halves is considered to be the interdigitated length of the neighboring halves which are oppositely electrically connected (e.g., finger halves 24 D and E in the case of split fingers 24C, D and 24 E, F; finger halves 24F and G in the case of split fingers 24E, F and 24G, H; and finger halves 24H and I in the case of split fingers 24G, H and 24I, J), since the electrical field is strongest at that location.

In accordance with another aspect of this invention, all relevant physical and electrical parameters of both the primary and dummy transducers 18 and 20 are taken into account in designing the filter 10, so that their respective reflections to the transducer 14 are exactly opposite in phase and equal in amplitude, for echo cancellation. The prior art, as exemplified by the Dias patent cited above, did attempt such echo cancellation by determining the phase difference between primary and dummy transducer reflections on the basis of their respective displacements along an x axis parallel to the acoustic beam axis 28. In this invention, the x axis displacement is one of the parameters used in determining the phase relationship between the primary and dummy echoes, but it is not the only one. Moreover, the amplitudes of the primary and dummy echoes must be taken into account, as well as their phase relationship, if total cancellation is to be achieved.

The approach of this invention is to write a comprehensive equation stating the conditions required for phase opposition and amplitude equality between the primary and dummy echoes, taking into account not only the x axis displacement parameter but also all other physical dimensions as well as internal and external electrical parameters which affect echo phase and amplitude. Then that equation is used to determine the physical and electrical characteristics of a dummy transducer which will accomplish total echo cancellation when used in tandem with a given primary transducer operated under given electrical conditions of external load.

For a wave of unity amplitude impinging thereon, the short-circuit current $I_{SH}$ induced in the primary transducer 18 will be the phasor expression $$I_{SH} = C_1 \sum_N l_i e^{-jkx_i}$$

where $C_1$ is a constant for the given physical system, the Greek letter $\Sigma$ (sigma) indicates summation over N elements, N being the number of elemental transducers in the transducer 18, and $l_i$ is the effective interdigitated length of an elemental transducer i located an x axis distance $x_i$ from an arbitrary reference line where $x=0$. The phase of this current $I_{SH}$ is related to the phase of the arriving acoustic wave at the reference line $x=0$.

The imaginary short circuit across the primary transducer 18 is now replaced by its actual external circuit 21

(i.e. the part of the T.V. receiver to which it is connected). Circuit 21 has an admittance of $Y_L$. The voltage V developed by transducer 18 across circuit 21 is given by the phasor expression $V = I_{SH}/(Y_T + Y_L)$ where $Y_T$ is the driving point admittance of transducer 18.

The acoustic wave reflected from a split-connected finger is caused solely by the electrical effects of the voltage impressed on it by the arriving acoustic wave, rather than by the effects of acoustic impedance and other mechanical factors. Thus the reflected wave W bounced from primary transducer 18 can be described mathematically, as a function of the impressed voltage V, by the phasor expression $$\frac{W}{V} = C_2 V \sum_N l_i e^{-jkxi}$$

in which $C_2$ is another constant for the given physical system. Therefore $$W = C_1 C_2 \left( \sum_N l_i e^{-jkxi} \right)^2 \frac{1}{Y_T + Y_L}.$$

By the same reasoning, the first reflection wave $W_D$ bounced from the dummy transducer 20 to the transducer 14 is given by the phasor expression $$W_D = C_1 C_2 \left( \sum_M l_j e^{-jkxj} \right)^2 \frac{1}{Y_{TD} + Y_D}$$

where M is the number of elemental transducers j in the transducer 20, $Y_{TD}$ is the transducer driving point admittance, and $Y_D$ is the admittance of any external circuit 22 connected thereacross. Even if there is no dummy external circuit, the dummy transducer 20 will have an inherent parasitic load admittance of some value $Y_D$.

For total phase cancellation, set W equal in amplitude and opposite in phase to $W_D$, as follows:

$$\left( \sum_N l_i e^{-jkxi} \right)^2 \frac{1}{Y_T + Y_L} = - \left( \sum_M l_j e^{-jkxj} \right)^2 \frac{1}{Y_{TD} + Y_D}.$$

Solving this equation for the physical parameters of the dummy transducer 20 gives $$\sum_M l_j e^{-jkxj} = \left( \sum_N l_i e^{-jkxi} \right) e^{\pm j \frac{\pi}{2}} \left( \frac{Y_{TD} + Y_D}{Y_T + Y_L} \right)^{\frac{1}{2}}.$$

This expression gives the design criteria for the dummy transducer 20.

When the dummy transducer 20 is designed to satisy these criteria, expressed as a function not only of x axis displacement, but also as a function of the number of fingers in the primary and dummy transducers, their respective effective interdigitated lengths, the respective transducer driving point admittances, and their respective load admittances, then total phase cancellation will be achieved when the effects of the respective reflections from the primary and dummy transducer 18 and 20 are integrated upon receipt by the transducer 14.

The overall frequency response of the filter 10 can be somewhat improved if the transducer 14 is also apodized. But then it becomes impossible to achieve proper integration of the primary and dummy reflections, because the aperture of each of the finger pairs in transducer 14 does not cover the combined apertures of transducers 16 and 18.

Figure 2:
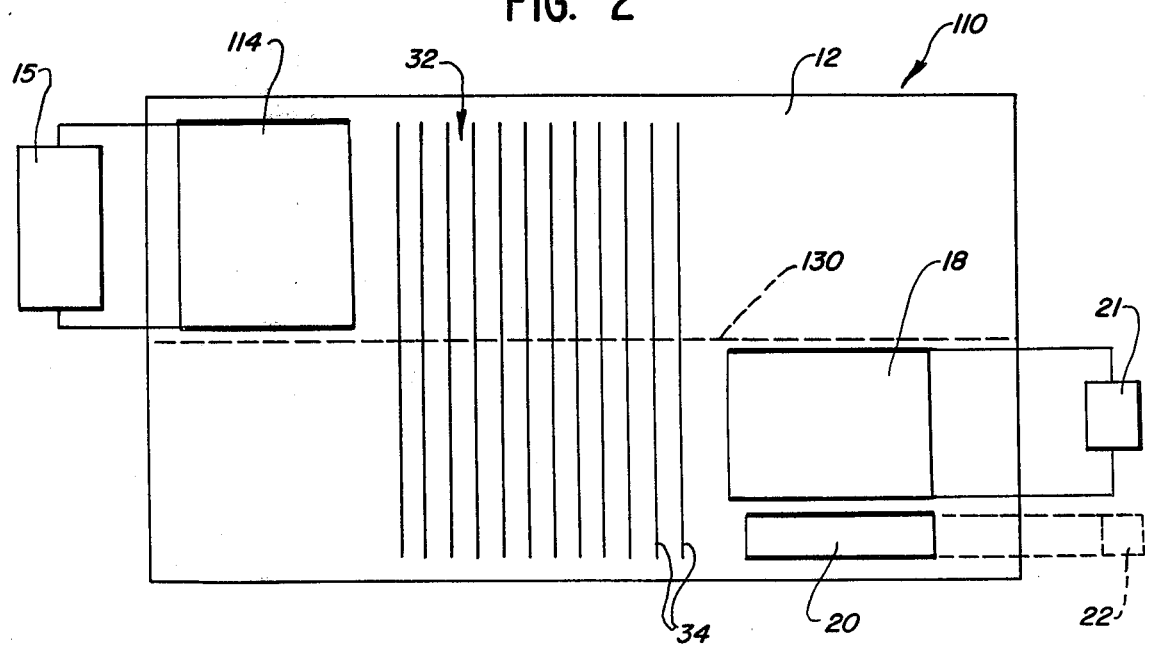
FIG. 2 is a schematic illustration of an alternative embodiment of such a filter.

Accordingly, in FIG. 2 there is seen an alternative embodiment of a filter 110 comprising a substrate 12 and a compound interdigital transducer system 18 and 20 designed according to the criteria stated above, coupled to a simple transducer 114. (All transducers illustrated from this point on are shown only in schematic form, and their characteristics, where relevant, described verbally). In order to guarantee that the effects of the reflections from the primary and dummy transducers 18 and 20 upon the transducer 114 will be integrated, and also that their apertures will be matched, transducer 114 is located on a third track, separated from the respective tracks of the transducers 18 and 20 by an imaginary boundary 130, and a multi-strip coupler device 32 is provided.

As is known in the art, such coupler devices comprise a plurality of conductive lines 34 printed on the substrate 10, without any bus bars. When lines 34 span all three tracks of the respective transducers 114, 18 and 20, the coupler 32 transfers all acoustic waves (including reflections) between the track of the transducer 114 and the tracks of transducers 18 and 20. In the process of transferring reflections from transducers 18 and 20 to transducer 114, coupler 32 inherently integrates them because (like split-connected fingers) the coupler is a solely voltage-responsive device, and acts to add the respective voltages impressed upon it by the two reflections.

As a result, simple transducer 114 can have any desired configuration. It can have 50% duty cycle single fingers instead of split fingers if desired (a design which helps to reduce spurious responses to interference near the third harmonic of the I.F. in a T.V. receiver), and/or it can be apodized. In any case the echo integration function and the aperture matching function are both performed by the coupler 32, and thus any type of transducer 114 is matched with apodized primary and dummy transducers 18 and 20, while preserving the phase cancellation effect of the integrated dummy and primary reflections.

The embodiments of FIGS. 1 and 2 demonstrate two approaches to designing a filter 10 or 110, one side of which (either the input side or the output side) is a simple transducer system 14 or 114 (which in the latter case includes coupler 32), while the other side is a compound transducer system comprising a pair of echo-cancelling primary and dummy transducers. So far as is known, the prior art does not disclose the concept of a filter in wich the input side has a compound echo-cancelling transducer system, regardless of the design technique used to insure phase compensation.

When the output side of the filter 10 or 110 is the compound system 18, 20, the first transit is the acoustic I.F. signal from a single input transducer 14 or 114, the second transit is a pair of phase-compensating reflections from respective output transducers 18 and 20, and there is no third transit because the effect of these reflections on input transducer 14 or 114 produces mutual cancellation. If the input side of the filter 10 or 110 is the compound system 18, 20, then the first transit is the acoustic I.F. signal from primary transducer 18, the second transit is a reflection from output transducer 14 or 114, and the third transit is a pair of phase-compensating reflections from the primary and dummy transducers 18 and 20. But because the two reflections are mutually cancelling, they induce a net triple-transit effect of zero in the output transducer 14 or 114, avoiding any ghost image on the T.V. screen. Thus the second reflection can be cancelled independently of the first reflection.

Figure 3:
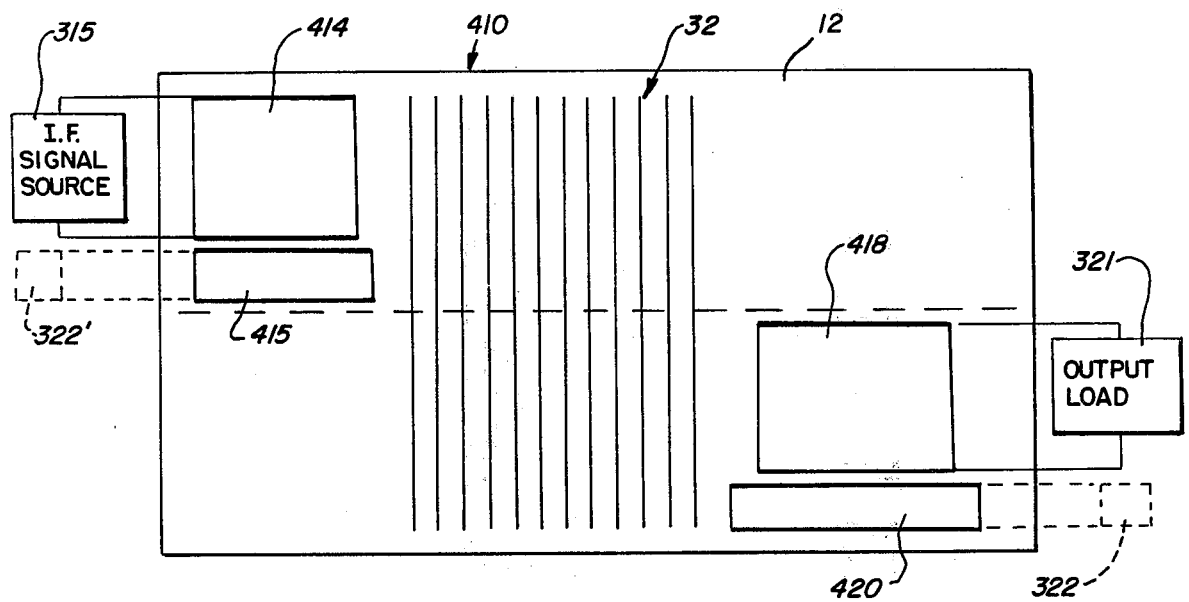
FIG. 3 is a schematic illustration of a surface acoustic wave filter in which both the input and output transducer systems are optimized for suppression of both the first and second reflections in accordance with this invention.

In order to cancel both the first and second reflections, the embodiment of FIG. 3 shows a filter 410 having a substrate 12 having both a compound output transducer system and a compound input transducer system. The former includes a primary output transducer 418 connected to an output load 321 and a dummy output transducer 420 for first reflection cancellation. Transducer 420 may or may not be connected to an external load 322. The input system includes a primary input transducer 414 connected to an I.F. signal source 315 and a dummy input transducer 415 for second reflection cancellation. The latter may or may not be connected to an external load 322'. Both of the dummy transducers 420 and 415 are designed according to the procedure described above, taking into account all the relevant physical and electrical parameters.

As many as possible, and preferably all four, of the transducers should be of the split-connected type, and apodized to improve their frequency response. Even if apodization is not used, in order to couple two tandem input transducers to two tandem output transducers located on four separate tracks as in FIG. 3, a multistrip coupler 32 is employed, spanning all four tracks. This coupler integrates and transfers all acoustic signals and reflections passing back and forth between each input transducer track and each output transducer track, and the dummy transducers 420 and 415 provide total phase cancellation of each successive reflection.

Each of the embodiments described herein provides optimal echo cancellation over a bandwidth as broad as that of the transducers themselves, because the echo phase relationships do not depend solely upon displacement along the x (acoustic beam) axis, but are calculated in terms of all the relevant physical and electrical parameters. The required phase cancellation relationship can be achieved for any external load conditions under which it is desired to use the filter. The design can be used for cancellation of both forwardly and backwardly directed reflections. Finally, the invention permits echo integration and aperture matching of apodized transducers on both the input and output side of the filter.

With any of the approaches disclosed herein, the insertion loss of the filter can be reduced (by increasing the coupling factor or by inductive tuning) without increasing the triple transit echo to undesired levels.

There may be other variations of the invention which fall within the scope of the novel principle taught herein. For this reason, the disclosed embodiments are to be taken as merely exemplary, and such variations are intended to be covered by the following claims.

I claim:

1. A surface acoustic wave device of the type comprising:
   input and output transducer systems;
   at least one of said systems including a primary interdigital transducer having a fundamental passband, and a dummy interdigital transducer;
   said transducers producing primary and dummy reflections respectively;
   and means for integrating the effects of said primary and dummy reflections upon the other of said transducer systems;
   said dummy transducer being arranged so that the integrated phasor sum of said primary and dummy reflections is suppressed to a low level;
   said other transducer system including an interdigital transducer, each of said three interdigital transducers being located upon an individual track, and said integrating means being a device for coupling said tracks.

2. In a surface acoustic device of the type having a substrate with at least two laterally separated tracks; means, including sending electroacoustic transducer means on said substrate, for generating a surface acoustic wave and receiving a reflection thereof, or reflecting a surface acoustic wave and receiving a re-reflection thereof, and for distributing said generated, reflected or re-reflected waves over both of said tracks; primary interdigital receiving surface acoustic transducer means positioned on a first one of said tracks for receiving and reflecting or re-reflecting said wave; and dummy interdigital receiving surface acoustic transducer means positioned on a second one of said tracks for also receiving and reflecting or re-reflecting said wave; the improvement wherein said dummy receiving transducer means substantially satifies the equation:

$$\sum_M l_j e^{-jkx_j} = \left( \sum_N l_i e^{-jkx_i} \right) e^{\pm j\frac{\pi}{2}} \cdot \left( \frac{Y_{TD} + Y_D}{Y_T + Y_L} \right)^{\frac{1}{2}}$$

where M and N are the numbers of equivalent interdigital elements in said dummy and primary receiving transducer means respectively, $l_j$ and $l_i$ are the equivalent interdigitated lengths of such elements for said dummy and primary receiving transducer means respectively, $x_j$ and $x_i$ are the transverse distances of such elements from a reference location, $Y_{TD}$ and $Y_T$ are the driving point admittances of said dummy and primary receiving transducer means respectively, and $Y_D$ and $Y_L$ are the admittances of any external impedances connected across the dummy and primary receiving transducer means respectively, or their parasitic equivalents.

3. A surface acoustic device comprising:
   a substrate with at least four laterally separated tracks;
   means acoustically coupling said tracks;
   primary input surface acoustic transducer means on a first one of said tracks for generating an acoustic wave, for receiving a first reflection thereof, and for contributing to a second reflection thereof;
   dummy input surface acoustic transducer means on a second one of said tracks for also receiving said first reflection and also contributing to said second reflection;
   primary output surface acoustic transducer means on a third one of said tracks for receiving said acoustic wave, for contributing to said first reflection thereof, and for receiving said second reflection thereof;
   and dummy output surface acoustic transducer means on a fourth one of said tracks for also receiving said acoustic wave and also contributing to said first reflection thereof.

4. A device as in claim 3 wherein said dummy input transducer means is arranged so that its contribution to said second reflection is at least approximately equal in amplitude and opposite in phase to the contribution thereto of said primary output transducer means.

5. A device as in claim 3 wherein said dummy output transducer means is arranged so that its contribution to said first reflection is at least approximately equal in amplitude and opposite in phase to the contribution thereto of said primary output transducer means.

6. A device as in claim 3 wherein said dummy output transducer means is arranged so that its contribution to said first reflection is at least approximately equal in amplitude and opposite in phase to the contribution thereto of said primary output transducer means, and said dummy input transducer means is arranged so that its contribution to said second reflection is at least approximately equal in amplitude and opposite in phase to the contribution thereto of said primary input transducer means.

7. In a surface acoustic wave device having a substrate, primary input surface acoustic transducer means on said substrate for generating an acoustic wave, and an acoustic wave receiving system including primary output surface acoustic transducer means on said substrate for receiving said wave, said receiving system reflecting a portion of said wave back to said input transducer means, said input transducer means re-reflecting a portion of said reflected wave back to said output transducer means, and dummy input transducer means arranged to re-reflect back to said output transducer means a portion of said reflected wave which is substantially equal in amplitude and opposite in phase to the portion of said reflected wave which is re-reflected by said primary input transducer means; the improvement wherein:

said primary and dummy input transducer means are on separate acoustic tracks, and said receiving system comprises means coupling said tracks whereby to integrate said waves re-reflected from said primary and dummy input transducer means respectively, said track coupling means being coupled also to said output transducer means whereby the electrical-output-producing effect thereon of both said re-reflected waves is integrated.

8. An acoustic wave device as in claim 7 wherein said receiving system further comprises dummy output transducer means arranged to receive from said track coupling means said acoustic wave generated by said primary input transducer means, and to reflect back to said track coupling means a wave which is substantially equal in amplitude and opposite in phase to said wave reflected by said primary output transducer means.

9. A surface acoustic device of the type comprising:
an acoustic wave sending system;
an acoustic wave receiving system;
each of said systems including a plurality of individual apodized interdigital surface acoustic transducers;
said individual transducers each being on a separate track;
and means for integrating the effect of respective acoustic waves which are reflected from said individual transducers of either one of said systems upon said individual transducers of the other system, including track coupling means spanning the tracks of all of said individual transducers.

10. A device as in claim 9 wherein one of said individual transducers of each said system is arranged to reflect an acoustic wave which is opposite in phase and substantially equal in amplitude to that which is reflected by the other of said individual transducers of the same said system.

* * * * *